(12) United States Patent
Min et al.

(10) Patent No.: US 7,800,931 B2
(45) Date of Patent: Sep. 21, 2010

(54) FERROELECTRIC RANDOM ACCESS MEMORY APPARATUS AND METHOD OF DRIVING THE SAME

(75) Inventors: Byung-Jun Min, Suwon-si (KR); Kang-Woon Lee, Seoul (KR); Han-Joo Lee, Seoul (KR); Byung-Gil Jeon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 114 days.

(21) Appl. No.: 12/228,590

(22) Filed: Aug. 14, 2008

(65) Prior Publication Data

US 2009/0052224 A1    Feb. 26, 2009

(30) Foreign Application Priority Data

Aug. 23, 2007    (KR) .................. 10-2007-0085181

(51) Int. Cl.
   *G11C 11/22* (2006.01)
(52) U.S. Cl. .................... 365/145; 365/65; 365/189.15; 365/189.04; 365/189.16; 365/205
(58) Field of Classification Search .................. 365/145, 365/65, 189.15, 189.04, 189.16, 205
See application file for complete search history.

(56) References Cited

U.S. PATENT DOCUMENTS

| | | | |
|---|---|---|---|
| 6,912,149 B2 | 6/2005 | Yamaoka et al. | |
| 7,221,578 B2 | 5/2007 | Lee et al. | |
| 7,304,882 B2 | 12/2007 | Lee et al. | |
| 7,394,717 B2 * | 7/2008 | Hidaka | 365/230.03 |
| 2004/0017704 A1 | 1/2004 | Yamaoka et al. | |
| 2006/0126372 A1 | 6/2006 | Lee et al. | |
| 2006/0146592 A1 | 7/2006 | Lee et al. | |

FOREIGN PATENT DOCUMENTS

| | | |
|---|---|---|
| JP | 2004-055007 A | 2/2004 |
| KR | 10-2006-0066849 A | 6/2006 |
| KR | 10-2006-0079929 A | 7/2006 |

* cited by examiner

*Primary Examiner*—Thong Q Le
(74) *Attorney, Agent, or Firm*—Mills & Onello LLP

(57) ABSTRACT

In a ferroelectric random access memory device that can allow a stable burst read operation and a method of driving a ferroelectric random access memory device thereof, the ferroelectric random access memory device comprises first and second memory cell sections, each comprising a plurality of ferroelectric memory cells, and a read circuit that sequentially performs a burst read operation on the first and second memory cell sections such that a read operation of the first memory cell section partially overlaps a read operation of the second memory cell section. When a chip is disabled during the read operation of the first memory cell section, the read circuit writes back data in the second memory cell section in response to the extent to which the read operation of the second memory cell section has been performed.

19 Claims, 7 Drawing Sheets

FERROELECTRIC RANDOM ACCESS MEMORY APPARATUS AND METHOD OF DRIVING THE SAME

CROSS REFERENCE TO RELATED APPLICATION

This application claims priority to Korean Patent Application No. 10-2007-0085181 filed on Aug. 23, 2008 in the Korean Intellectual Property Office, the disclosure of which is incorporated herein by reference in its entirety.

BACKGROUND OF THE INVENTION

1. Field of the Invention

Embodiments of the present invention relate to a ferroelectric random access memory device and a method of driving the same.

2. Description of the Related Art

A ferroelectric random access memory device (Ferroelectric Random Access Memory; FRAM, FeRAM) that uses a ferroelectric thin film is a type of ferroelectric random access memory device, and it is non-volatile device, in that it can store information in a condition where power is not supplied to the device. In addition, FRAM devices can support high-speed access and have low power consumption and strong shock resistance. Accordingly, FRAMs can be used as a storage medium for various electronic apparatuses, such as portable computers, cellular telephones, and gaming machine, which can store and search files.

The ferroelectric random access memory device includes ferroelectric memory cells, each cell being composed of a ferroelectric capacitor and an access transistor. Each cell stores logical data, for example, "1" or "0" binary data, according to the electrical polarization state of the ferroelectric capacitor. When a voltage is applied to both ends of the ferroelectric capacitor, the ferroelectric thin film is polarized according to the direction of the electric field.

FIG. 1 is a timing chart illustrating the signals involved in a read operation of a conventional ferroelectric random access memory device.

First, signals will be described with reference to FIG. 1. A chip enable signal CEB represents whether a chip is enabled/disabled. A plate line control signal PPLS is used to control a plate line that is connected to one end of the ferroelectric capacitor. A sense amplifier enable signal SAEN is used to enable a sense amplifier circuit that is coupled to a ferroelectric memory cell to be read.

A read operation of the ferroelectric random access memory device typically includes a charge-sharing operation, a sensing operation, and a write-back operation.

The charge-sharing operation is performed during a charge-sharing period t1. During the charge-sharing period t1, the plate line control signal PPLS is enabled, and the sense amplifier enable signal SAEN is disabled. The sensing operation is performed during a sensing period t2. During the sensing period t2, the plate line control signal PPLS is enabled, and the sense amplifier enable signal SAEN is enabled. The write-back operation is performed during a write-back period t3. During the write-back period t3, the plate line control signal PPLS is disabled, and the sense amplifier enable signal SAEN is enabled.

During the charge-sharing period t1, a voltage corresponding to data stored in the ferroelectric capacitor is transferred to a bit line BL. During the sensing period t2, the sense amplifier senses and amplifies data that is on the bit line BL. During the write-back period t3, the original data that is stored in the ferroelectric memory cell is written back following the sensing operation. The write-back period t3 is needed because the ferroelectric random access memory device reads data using a process that is referred to as a "destructive read". Here, the destructive read means that when data is read from a memory cell where "1" is stored, the data stored in the memory cell is temporarily changed (that is, data "0" is stored) during the read operation. Accordingly, to prevent stored data from becoming permanently changed after the read operation, original data needs to be written back in the write-back operation following the sensing operation.

SUMMARY OF THE INVENTION

An object of the embodiments of the present invention is to provide a ferroelectric random access memory device that can allow a stable burst read operation.

Another object of the embodiments of the present invention is to provide a method of driving a ferroelectric random access memory device that can allow a stable burst read operation.

In one aspect, a ferroelectric random access memory device comprises: first and second memory cell sections, each comprising a plurality of ferroelectric memory cells; and a read circuit that sequentially performs a burst read operation on the first and second memory cell sections such that a read operation of the first memory cell section partially overlaps a read operation of the second memory cell section, and that, when a chip is disabled during the read operation of the first memory cell section, writes back data in the second memory cell section in response to the extent to which the read operation of the second memory cell section has been performed.

In one embodiment, the read operation of each of the memory cell sections includes a charge-sharing operation, a sensing operation, and a write-back operation.

In another embodiment, when the second memory cell section is performing the charge-sharing operation during a time when the chip is disabled, the second memory cell section performs the charge-sharing operation and the write-back operation for a prescribed time period.

In another embodiment, the second memory cell section further performs the sensing operation for the prescribed time.

In another embodiment, when the second memory cell section is performing the sensing operation during a time when the chip is disabled, the second memory cell section performs the write-back operation for a prescribed time period.

In another embodiment, the second memory cell section immediately interrupts the sensing operation that is being performed, and performs the write-back operation.

In another embodiment, the read circuit comprises: first and second sense amplifier circuits corresponding to the first and second memory cell sections; a first signal generator providing a first plate line control signal and a first sense amplifier enable signal to the first memory cell section and the first sense amplifier circuit, respectively; and a second signal generator providing a second plate line control signal and a second sense amplifier enable signal to the second memory cell section and the second sense amplifier circuit, respectively.

In another embodiment: the second signal generator comprises a second plate line control signal generator providing the second plate line control signal, and a second sense amplifier enable signal generator providing the second sense amplifier enable signal; the second plate line control signal is enabled in response to a section selection signal, and is disabled when the chip enable signal is disabled and the second sense amplifier enable signal is enabled; and the second sense amplifier enable signal is enabled when a prescribed time elapses after the second plate line control signal is enabled, and is disabled when the prescribed time elapses after the second plate line control signal is disabled.

In another aspect, a method of driving a ferroelectric random access memory device comprises: providing first and second memory cell sections, each comprising a plurality of ferroelectric memory cells; and sequentially performing a burst read operation on the first and second memory cell section such that a read operation of the first memory cell section partially overlaps a read operation of the second memory cell section, and, when a chip is disabled during the read operation of the first memory cell section, writing back data in the second memory cell section in response to the extent to which the read operation of the second memory cell section has been performed.

In one embodiment, the read operation of each of the memory cell sections includes a charge-sharing operation, a sensing operation, and a write-back operation.

In another embodiment, when the second memory cell section is performing the charge-sharing operation during a time when the chip is disabled, the second memory cell section performs the charge-sharing operation and the write-back operation for a prescribed time period.

In another embodiment, the second memory cell section further performs the sensing operation for the prescribed time.

In another embodiment, when the second memory cell section is performing the sensing operation during a time when the chip is disabled, the second memory cell section performs the write-back operation for a prescribed time period.

In another embodiment, the second memory cell section immediately interrupts the sensing operation that is being performed, and performs the write-back operation.

In another aspect, a method of driving a ferroelectric random access memory device comprises: providing first and second memory cell sections, each comprising a plurality of ferroelectric memory cells; when a chip is disabled during a read operation of the first memory cell section, primarily determining whether a plate line control signal corresponding to the second memory cell section is enabled; and when the plate line control signal is enabled, secondarily determining whether a sense amplifier enable signal corresponding to the second memory cell section is enabled.

In one embodiment, if it is determined in the secondarily determining that the sense amplifier enable signal is disabled, the second memory cell section performs a charge-sharing operation and a write-back operation for a prescribed time period and ends an internal chip operation.

In another embodiment, if it is determined in the secondarily determining that the sense amplifier enable signal is enabled, the second memory cell section performs a write-back operation for a prescribed time period and ends an internal chip operation.

In another embodiment, the second memory cell section immediately interrupts a sensing operation that is being performed, and performs the write-back operation.

In another embodiment, if it is determined in the primary determining that the plate line control signal is disabled, an internal chip operation ends after the read operation of the first memory cell section is completed.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF EMBODIMENTS

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 1:
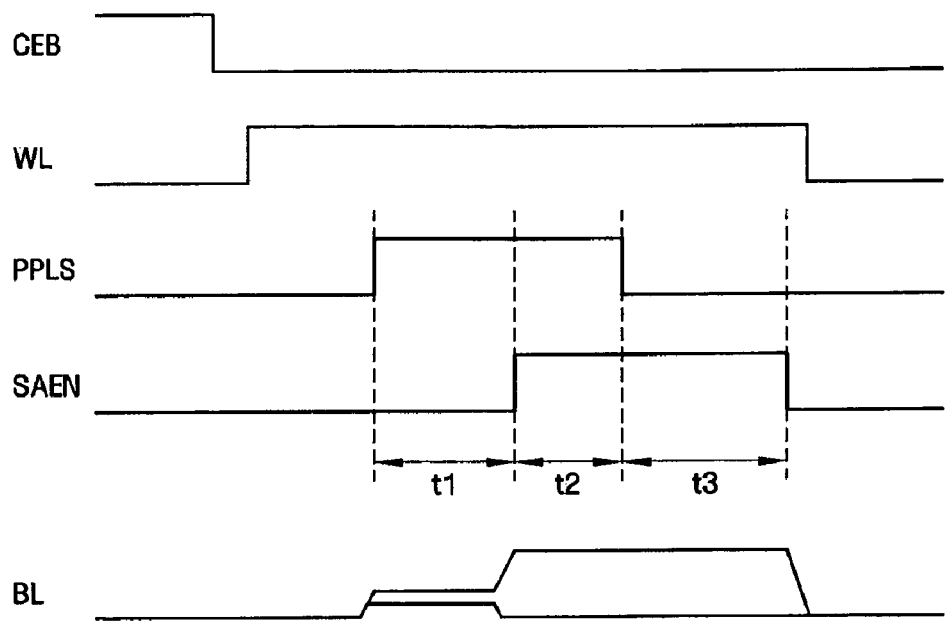
FIG. 1 is a timing chart illustrating a read method in a known ferroelectric random access memory device.
Figure 2:
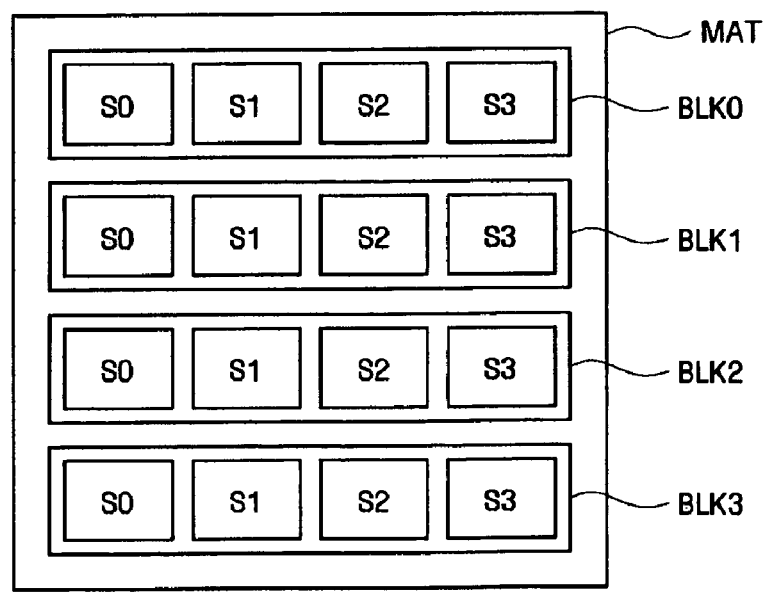
FIG. 2 is a block diagram illustrating a ferroelectric random access memory device according to an embodiment of the present invention.

FIG. 2 is a block diagram illustrating a ferroelectric random access memory device according to an embodiment of the present invention.

Referring to FIG. 2, a ferroelectric random access memory device according to an embodiment of the present invention includes a memory cell mat MAT that has a plurality of ferroelectric memory cells. The memory cell mat MAT has a hierarchical structure. Specifically, the memory cell mat MAT includes a plurality of memory cell blocks BLK0 to BLK3, and each of the memory cell blocks BLK0 to BLK3 includes a plurality of memory cell sections S0 to S3.

For the convenience of explanation, FIG. 2 illustrates a case where the memory cell mat MAT includes four memory cell blocks BLK0 to BLK3, and each of the memory cell blocks BLK0 to BLK3 includes four memory cell sections S0 to S3. Embodiments of the present invention are not thus limited. For example, the memory cell mat MAT may include eight memory cell blocks, and each of the memory cell blocks may include eight memory cell sections.

Figure 3:
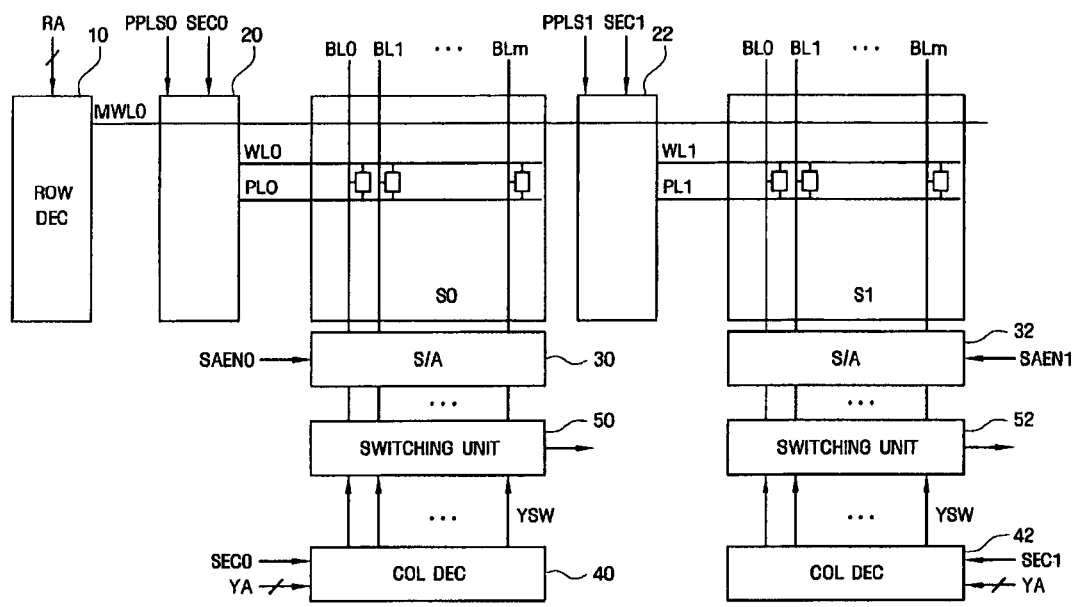
FIG. 3 is a block diagram showing portions related to a read operation in the first and second memory cell sections S0 and S1 of the first memory cell block BLK0 shown in FIG. 2.
Figure 4:
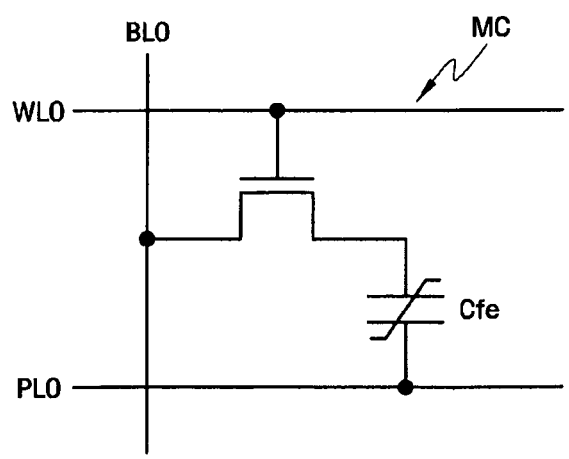
FIG. 4 is a circuit diagram showing a ferroelectric memory cell in a ferroelectric random access memory device according to an embodiment of the present invention.
Figure 5:
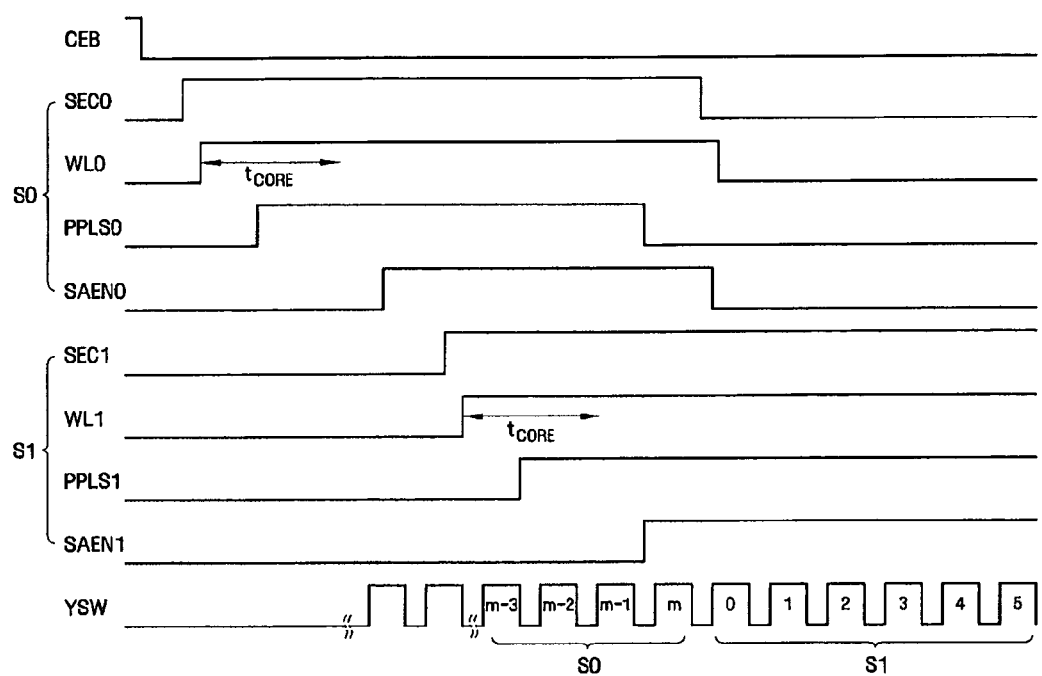
FIG. 5 is a timing chart illustrating a read operation of a ferroelectric random access memory device according to an embodiment of the present invention.

The constituent blocks and the operation of the ferroelectric random access memory device will be described with reference to FIGS. 3 to 5. FIG. 3 is a block diagram showing portions related to a read operation in the first and second memory cell sections S0 and S1 of the first memory cell block BLK0 shown in FIG. 2. The configuration shown in FIG. 3 is illustrative, and is not intended to limit the present invention. FIG. 4 is a circuit diagram showing a ferroelectric memory cell in a ferroelectric random access memory device according to an embodiment of the present invention. FIG. 5 is a timing chart illustrating a read operation of a ferroelectric random access memory device according to an embodiment of the present invention.

First, referring to FIG. 3, the ferroelectric random access memory device according to an embodiment of the present invention reads data stored in the first and second memory cell sections S0 and S1 using a burst read operation. For the burst read operation, the ferroelectric random access memory device includes the first and second memory cell sections S0 and S1, a row decoder 10, a first word line and plate line driver 20, a second word line and plate line driver 22, first and second sense amplifier circuits 30 and 32, first and second column decoders 40 and 42, and first and second switching units 50 and 52.

Each of the first and second memory cell sections S0 and S1 includes a plurality of ferroelectric memory cells MC. As shown in FIG. 4, each of the plurality of ferroelectric memory cells MC includes one access transistor M and one ferroelectric capacitor Cfe. The access transistor M is coupled between a bit line BL0 and a word line WL0, and the ferroelectric capacitor Cfe is coupled to a plate line PL0. In FIG. 4, each ferroelectric memory cell MC includes one access transistor M and one ferroelectric capacitor Cfe; however, the embodiments of the present invention are not limited thereto. For example, in other embodiments, each ferroelectric memory cell can include two access transistors and two ferroelectric capacitors.

The row decoder 10 decodes a row address RA and enables a main word line MWL0 selected from a plurality of main word lines.

The first word line and plate line driver 20 receives a first section selection signal SEC0 and a first plate line control signal PPLS0, and selects a word line WL0 and a plate line PL0 in the first memory cell section S0. The second word line and plate line driver 22 receives a second section selection signal SEC1 and a second plate line control signal PPLS1, and selects a word line WL1 and a plate line PL1 in the second memory cell section S1. A plurality of memory cells MC corresponding the selected word lines WL0 and WL1 and plate lines PL0 and PL1 apply stored data, when selected, to a plurality of bit lines BL0 to BLm.

The first sense amplifier circuit 30 corresponds to first memory cell blocks BLK0 to BLK3, and operates in response to a first sense amplifier enable signal SAEN0. The second sense amplifier circuit 32 corresponds to second memory cell blocks BLK0 to BLK3, and operates in response to a second sense amplifier enable signal SAEN1. The first and second sense amplifier circuits 30 and 32 sense and amplify data that is present on the plurality of bit lines BL0 to BLm.

The first column decoder 40 decodes the first section selection signal SEC0 and a column address YA, and sequentially supplies a plurality of column selection signals YSW. The second column decoder 42 decodes the second section selection signal SEC1 and a column address YA, and sequentially supplies a plurality of column selection signals YSW.

The first and second switching units 50 and 52 receive the supplied column selection signals YSW, and sequentially output the amplified data to data lines (not shown).

Here, as shown in FIGS. 3 and 5, illustrating a read operation, a chip enable signal CEB is initially enabled at a low level.

Next, when the first section selection signal SEC0 becomes enabled at a high level, the word line WL0, the first plate line control signal PPLS0, and the first sense amplifier enable signal SAEN0 are sequentially enabled.

When the second section selection signal SEC1 is enabled at a high level, the word line WL1, the second plate line control signal PPLS1, and the second sense amplifier enable signal SAEN1 are sequentially enabled.

In order to read the data stored in the first and second memory cell sections S0 and S1 using the burst read operation, the read operation of the second memory cell section S1 should be initiated before the read operation of the first memory cell section S0 ends. That is, the read operation of the first memory cell section S0 at least partially overlaps the read operation of the second memory cell section S1.

Specifically, in the burst read operation, as shown in FIG. 5, a plurality of column selection signals YSW for outputting data stored in the first memory cell section S0, and a plurality of column selection signals YSW outputting data stored in the second memory cell section S1 are sequentially enabled. Accordingly, data should be transferred to the second sense amplifier circuit 32, and then amplified, before the column selection signal YSW(0) for outputting first data stored in the second memory cell section S1 is enabled. Therefore, the second plate line control signal PPLS1 and the second sense amplifier enable signal SAEN1 need to be enabled before the first plate line control signal PPLS0 and the first sense amplifier enable signal SAEN0 become disabled. A minimum time margin required at that time is referred to as "core time $t_{CORE}$".

Since the read operation of the first memory cell section S0 overlaps the read operation of the second memory cell section S1, if the chip becomes disabled during the read operation of the first memory cell section S0 (that is, the chip enable signal is disabled), it is necessary to write back data in the second memory cell section S1, as well as in the first memory cell section S0. Therefore, when the chip is disabled during the read operation of the first memory cell section S0, if data is written back in only the first memory cell section S0, data that is stored in the second memory cell section S1 may be destroyed.

Accordingly, in the embodiments of the present invention, when the chip is disabled during the read operation of the first memory cell section S0, in order to prevent data stored in the second memory cell section S1 from becoming destroyed, the write-back operation of the second memory cell section S1 is ensured before the internal chip operation ends. An example of an embodiment capable of such ensuring the write-back operation will be described with reference to FIGS. 6 to 9.

Figure 6:
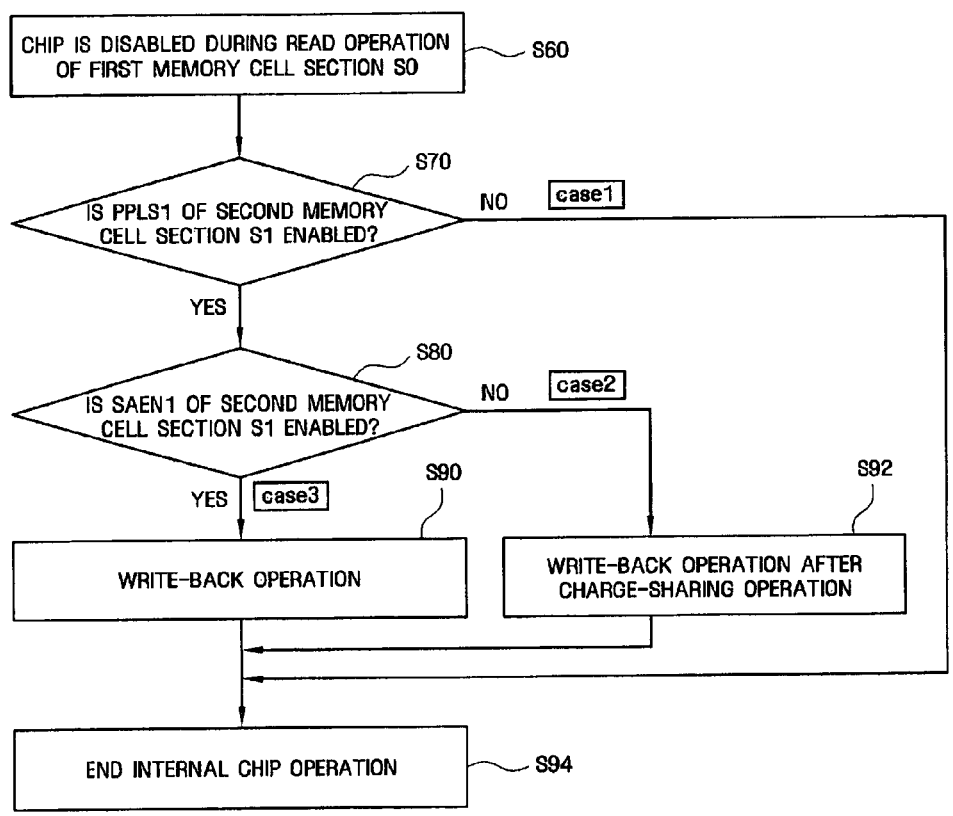
FIG. 6 is a flow diagram illustrating the operation of the ferroelectric random access memory device according to an embodiment of the present invention.
Figure 7:
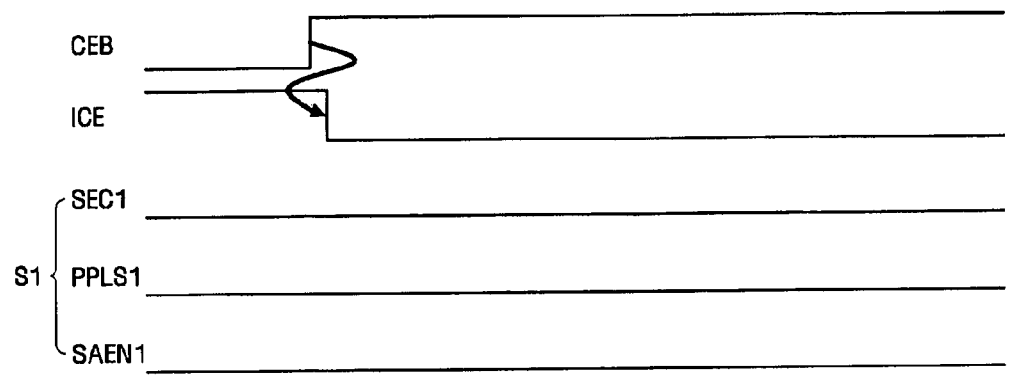
FIGS. 7, 8, 9 are timing charts corresponding to the cases shown in FIG. 6.
Figure 8:
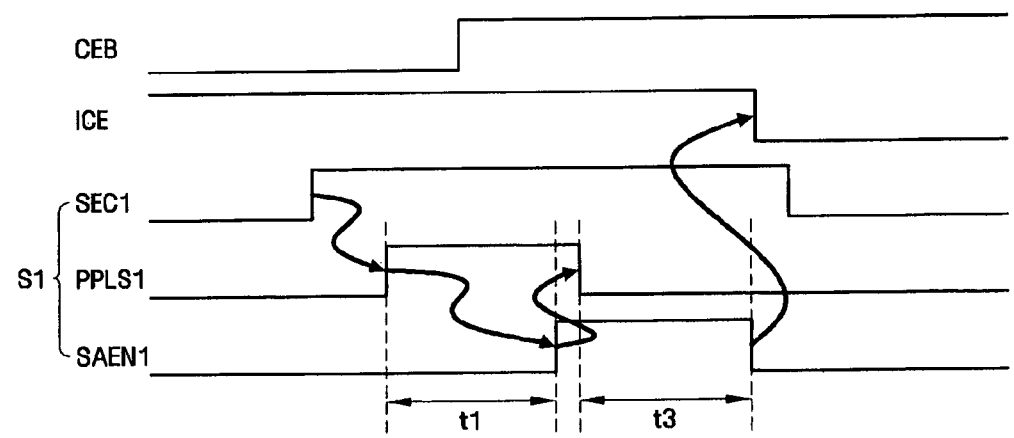
Figure 9:
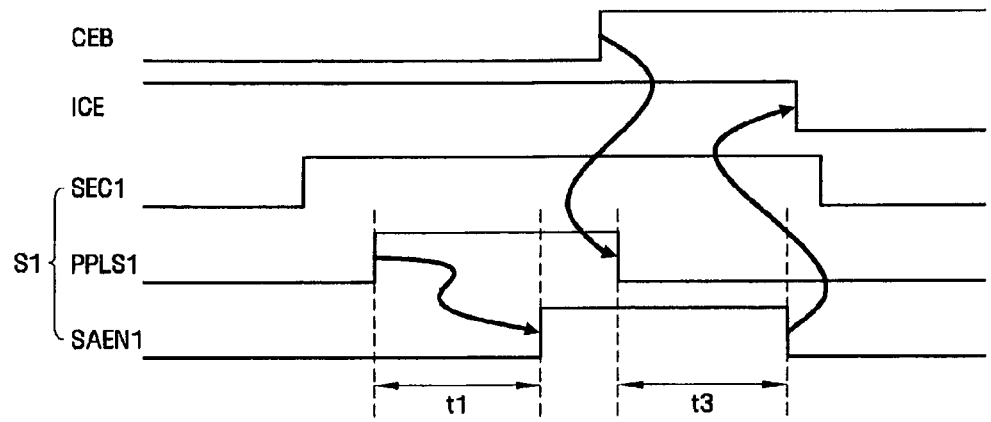

FIG. 6 is a flowchart illustrating the operation of the ferroelectric random access memory device according to an embodiment of the present invention. FIGS. 7 to 9 are timing charts corresponding to the cases shown in FIG. 6.

Referring to FIG. 6, when the chip becomes disabled during the read operation of the first memory cell section S0, the ferroelectric random access memory device according to an embodiment of the present invention determines the extent to which the read operation of the second memory cell section S1 has been performed. After it is determined the extent to which the read operation of the second memory cell section S1 has been performed, it is determined whether to perform the write-back operation of the second memory cell section S1 and whether to end the internal chip operation.

Specifically, the determination is performed as follows.

At step S60, the chip becomes disabled during the read operation of the first memory cell section S0.

Next, it is determined whether the second plate line control signal PPLS1 corresponding to the second memory cell section S1 is enabled (Step S70).

When the second plate line control signal PPLS1 is not enabled (case1), it is determined that the second memory cell section S1 does not perform the charge-sharing operation. Then, if the read operation of the first memory cell section S0 ends, the internal chip operation ends immediately thereafter (Step S94). Referring to FIG. 7, it can be seen that, if the chip enable signal CEB is disabled at a high level, an internal chip enable signal ICE is disabled at a low level immediately thereafter.

Next, when the second plate line control signal PPLS1 is enabled, it is determined whether the second sense amplifier enable signal SAEN1 corresponding to the second memory cell section S1 is enabled (Step S80).

When the second plate line control signal PPLS1 is disabled (case2), the second memory cell section S1 is determined to be under the charge-sharing operation. During the charge-sharing period t1 in which the charge-sharing operation is performed, as described above, the second plate line control signal PPLS1 is enabled, and the second sense amplifier enable signal SAEN1 is disabled. In this case, in order to prevent data stored in the second memory cell section S1 from being destroyed, the charge-sharing operation is performed during the prescribed charge-sharing period t1, and the write-back operation is performed during the prescribed write-back period t3 (Step S92). The sensing operation may be selectively performed during the prescribed sensing period t2. Thereafter, the internal chip operation ends (Step S94)

Referring to FIG. 8, even after the chip enable signal CEB becomes disabled at the high level, the second plate line control signal PPLS1 is maintained at the high level. After the charge-sharing period t1 is completed, the second sense amplifier enable signal SAEN1 is enabled at the high level. In addition, after the write-back period t3 is completed, the second sense amplifier enable signal SAEN1 is disabled at the low level. Then, when the second sense amplifier enable signal SAEN1 becomes disabled, the internal chip enable signal ICE is disabled at the low level.

When the second plate line control signal PPLS1 is enabled (case3), the second memory cell section S1 is determined to be under the sensing operation. During the sensing period in which the sensing operation is performed, as described above, the second plate line control signal PPLS1 and the second sense amplifier enable signal SAEN1 are both enabled. In this case, in order to prevent data stored in the second memory cell section S1 from being destroyed, the write-back operation is performed during the prescribed write-back period t3 (Step S90). At this time, if necessary, the sensing operation that is currently performed may be immediately interrupted, and the write-back operation may be performed. Thereafter, the internal chip operation ends (Step S94).

Referring to FIG. 9, at the same time the chip enable signal CEB becomes disabled at the high level, the second plate line control signal PPLS1 is made to be disabled at the low level. That is, at the time the chip becomes disabled, the sensing operation immediately ends. Thereafter, after the write-back period t3 is completed, the second sense amplifier enable signal SAEN1 is disabled at the low level. Then, when the disabled second sense amplifier enable signal SAEN1 becomes disabled, the internal chip enable signal ICE is disabled at the low level.

Figure 10:
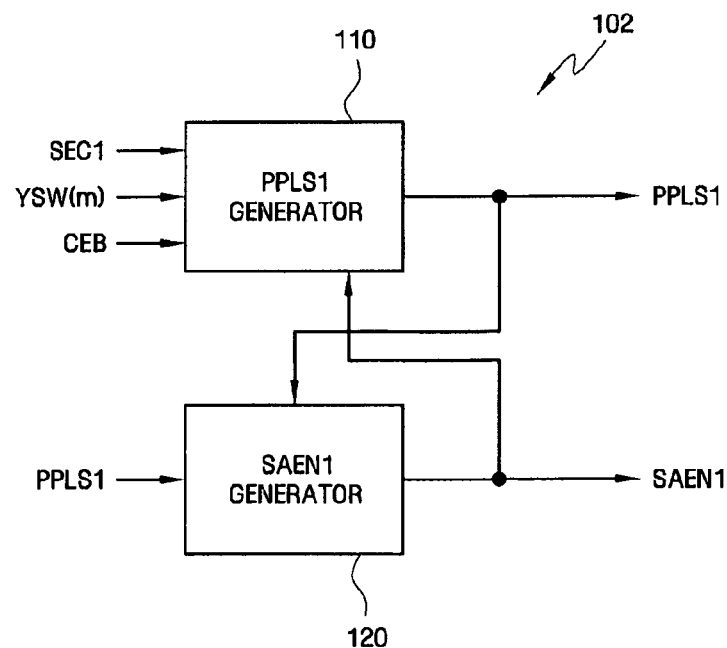
FIG. 10 is a block diagram of a configuration that implements the operation described with reference to FIGS. 6-9.
Figure 11:
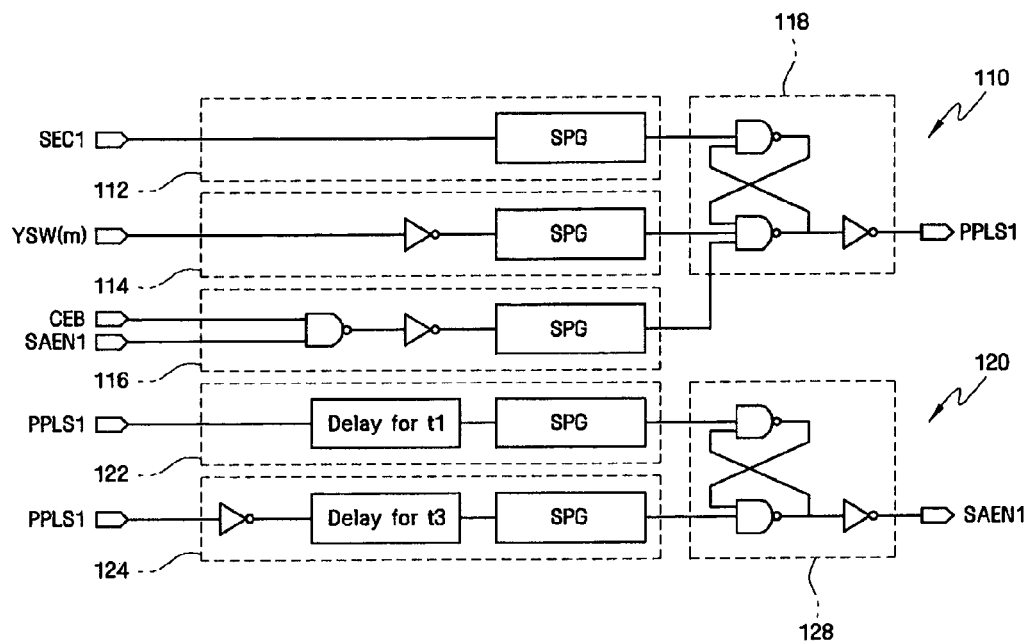
FIG. 11 is a circuit diagram corresponding to the block diagram of FIG. 10.

FIG. 10 is a block diagram of a configuration that implements the operation described with reference to FIGS. 6 to 9. FIG. 11 is a circuit diagram corresponding to the block diagram of FIG. 10. Though not shown, a ferroelectric random access memory device according to an embodiment of the present invention includes a signal generator, for example of the type shown in FIGS. 10 and 11. One of the two signal generators provides signals required to read data stored in the first memory cell section, and the other provides signals required to read data stored in the second memory cell section. Here, for convenience of explanation, there is shown in FIGS. 10 and 11 only the signal generator that provides the signals required to read data stored in the second memory cell section.

Referring to FIG. 10, a signal generator 102 provides the second plate line control signal PPLS1 and the second sense amplifier enable signal SAEN1 to the second memory cell section S1 and the second sense amplifier circuit 32, respectively. The signal generator 102 includes a second plate line control signal generator 110 and a second sense amplifier enable signal generator 120.

During normal operation, the second plate line control signal PPLS1 is enabled in response to the second section selection signal SEC1, and is disabled in response to the final column selection signal YSW(m). When the chip is disabled, if the chip enable signal CEB is disabled and the second sense amplifier enable signal SAEN1 is enabled, the second plate line control signal PPLS1 is disabled.

The second sense amplifier enable signal SAEN1 is enabled or disabled in response to the second plate line control signal PPLS1. Specifically, the second sense amplifier enable signal SAEN1 is enabled when a prescribed time elapses after the second plate line control signal PPLS1 is enabled, and is disabled when the prescribed time elapses after the second plate line control signal is disabled.

Referring to FIG. 11, the second plate line control signal generator 110 includes first to third input units 112, 114, and 116, and a first output unit 118.

The first input unit 112 includes a short pulse generator (SPG) that generates a short pulse in response to the second section selection signal SEC1. The short pulse generator is, for example, composed of a plurality of inverters and NAND circuits. The first input unit 112 controls the timing at which the second plate line control signal PPLS1 is enabled. If the second section selection signal SEC1 is enabled, the second plate line control signal PPLS1 becomes enabled.

The second input unit 114 includes an inverter that inverts the final column selection signal YSW(m), and a short pulse generator that generates a short pulse in response to the output from the inverter. The second input unit controls the timing at which the second plate line control signal PPLS1 is disabled. If the final column selection signal YSW(m) is enabled, the second plate line control signal PPLS1 becomes disabled.

The third input unit 116 includes a NAND circuit and an inverter that are used to perform an AND operation of the chip enable signal CEB and the second sense amplifier enable signal SAEN1, and a short pulse generator that generates a short pulse using the output from the inverter. As described above, the third input unit 116 is used to ensure that the write-back period should the chip become disabled during the read operation of the first memory cell section. In this case, the second plate line control signal PPLS1 is disabled in response to a combination of the chip enable signal CEB and the second sense amplifier enable signal SAEN1.

The first output unit 118 is a latch circuit that receives the output signals of the first to third input units 112, 114, and 116, and includes a NAND circuit and an inverter that are connected to each other.

The second sense amplifier enable signal generator 120 includes fourth and fifth input units 122 and 124, and a second output unit 128.

The fourth input unit 122 includes a delay circuit that receives the second plate line control signal PPLS1 and delays the received second plate line control signal PPLS1 for a prescribed time (in this embodiment, a time t1 corresponding to the charge sharing period), and a short pulse generator that generates a short pulse using the output from the delay circuit. The fourth input unit 122 controls the timing at which the second sense amplifier enable signal SAEN1 is enabled.

The fifth input unit 124 includes an inverter that receives and inverts the second plate line control signal PPLS1, a delay circuit that delays the output of the inverter for a prescribed time (in this embodiment, a time t3 corresponding to the write-back period), and a short pulse generator that generates a short pulse using the output from the delay circuit. The fifth input unit 124 controls the timing at which the second sense amplifier enable signal SAEN1 is disabled.

The second output unit 128 is a latch circuit that receives the output signals of the fourth and fifth input units 122 and 124, and includes a NAND, circuit and an inverter that are connected to each other.

According to the above-described ferroelectric random access memory device and the method of driving the same, when the burst read operation is performed, even in a case where the chip becomes disabled during the read operation of the first memory cell section, data in the second memory cell section can be retained.

While embodiments of the invention have been particularly shown and described with references to preferred embodiments thereof, it will be understood by those skilled in the art that various changes in form and details may be made herein without departing from the spirit and scope of the invention as defined by the appended claims.

What is claimed is:

1. A ferroelectric random access memory device comprising:
   first and second memory cell sections, each comprising a plurality of ferroelectric memory cells; and
   a read circuit that sequentially performs a burst read operation on the first and second memory cell sections such that a read operation of the first memory cell section partially overlaps a read operation of the second memory cell section, and that, when a chip is disabled during the read operation of the first memory cell section, writes back data in the second memory cell section in response to the extent to which the read operation of the second memory cell section has been performed.

2. The ferroelectric random access memory device of claim 1, wherein the read operation of each of the memory cell sections includes a charge-sharing operation, a sensing operation, and a write-back operation.

3. The ferroelectric random access memory device of claim 2, wherein, when the second memory cell section is performing the charge-sharing operation during a time when the chip is disabled, the second memory cell section performs the charge-sharing operation and the write-back operation for a prescribed time period.

4. The ferroelectric random access memory device of claim 3, wherein the second memory cell section further performs the sensing operation for the prescribed time.

5. The ferroelectric random access memory device of claim 2, wherein, when the second memory cell section is performing the sensing operation during a time when the chip is disabled, the second memory cell section performs the write-back operation for a prescribed time period.

6. The ferroelectric random access memory device of claim 5, wherein the second memory cell section immediately interrupts the sensing operation that is being performed, and performs the write-back operation.

7. The ferroelectric random access memory device of claim 1, wherein the read circuit comprises:
   first and second sense amplifier circuits corresponding to the first and second memory cell sections;
   a first signal generator providing a first plate line control signal and a first sense amplifier enable signal to the first memory cell section and the first sense amplifier circuit, respectively; and
   a second signal generator providing a second plate line control signal and a second sense amplifier enable signal to the second memory cell section and the second sense amplifier circuit, respectively.

8. The ferroelectric random access memory device of claim 7, wherein:
   the second signal generator comprises a second plate line control signal generator providing the second plate line control signal, and a second sense amplifier enable signal generator providing the second sense amplifier enable signal;
   the second plate line control signal is enabled in response to a section selection signal, and is disabled when the chip enable signal is disabled and the second sense amplifier enable signal is enabled; and
   the second sense amplifier enable signal is enabled when a prescribed time elapses after the second plate line control signal is enabled, and is disabled when the prescribed time elapses after the second plate line control signal is disabled.

9. A method of driving a ferroelectric random access memory device comprising:
- providing first and second memory cell sections, each comprising a plurality of ferroelectric memory cells; and
- sequentially performing a burst read operation on the first and second memory cell section such that a read operation of the first memory cell section partially overlaps a read operation of the second memory cell section, and, when a chip is disabled during the read operation of the first memory cell section, writing back data in the second memory cell section in response to the extent to which the read operation of the second memory cell section has been performed.

10. The method of claim 9, wherein the read operation of each of the memory cell sections includes a charge-sharing operation, a sensing operation, and a write-back operation.

11. The method of claim 10, wherein, when the second memory cell section is performing the charge-sharing operation during a time when the chip is disabled, the second memory cell section performs the charge-sharing operation and the write-back operation for a prescribed time period.

12. The method of claim 11, wherein the second memory cell section further performs the sensing operation for the prescribed time.

13. The method of claim 10, wherein, when the second memory cell section is performing the sensing operation during a time when the chip is disabled, the second memory cell section performs the write-back operation for a prescribed time period.

14. The method of claim 13, wherein the second memory cell section immediately interrupts the sensing operation that is being performed, and performs the write-back operation.

15. A method of driving a ferroelectric random access memory device comprising:
- providing first and second memory cell sections, each comprising a plurality of ferroelectric memory cells;
- when a chip is disabled during a read operation of the first memory cell section, primarily determining whether a plate line control signal corresponding to the second memory cell section is enabled; and
- when the plate line control signal is enabled, secondarily determining whether a sense amplifier enable signal corresponding to the second memory cell section is enabled.

16. The method of claim 15, wherein, if it is determined in the secondarily determining that the sense amplifier enable signal is disabled, the second memory cell section performs a charge-sharing operation and a write-back operation for a prescribed time period and ends an internal chip operation.

17. The method of claim 15, wherein, if it is determined in the secondarily determining that the sense amplifier enable signal is enabled, the second memory cell section performs a write-back operation for a prescribed time period and ends an internal chip operation.

18. The method of claim 17, wherein the second memory cell section immediately interrupts a sensing operation that is being performed, and performs the write-back operation.

19. The method of claim 15, wherein, if it is determined in the primary determining that the plate line control signal is disabled, an internal chip operation ends after the read operation of the first memory cell section is completed.

* * * * *